United States Patent [19]
Fujiwara et al.

[11] 4,237,183
[45] Dec. 2, 1980

[54] PROCESS FOR THE SURFACE TREATMENT OF A SYNTHETIC RESIN LENS AND THE PRODUCT THEREOF

[75] Inventors: Junichi Fujiwara, Yachimata; Kazuo Nakamura, Tokyo, both of Japan

[73] Assignee: Nihon Shinku Gijutsu Kabushiki Kaisha, Chigasaki, Japan

[21] Appl. No.: 894,249

[22] Filed: Apr. 7, 1978

Related U.S. Application Data

[63] Continuation of Ser. No. 714,262, Aug. 13, 1976, abandoned.

[30] Foreign Application Priority Data

Aug. 25, 1975 [JP] Japan ................................ 50-102088

[51] Int. Cl.² ............................................. B05D 5/06
[52] U.S. Cl. ..................................... 428/336; 427/42; 427/162; 427/248 R; 427/248 J; 427/296; 428/339; 428/429; 428/539; 428/934; 428/938
[58] Field of Search ....................... 427/12, 35, 38, 42, 427/162, 164, 166, 167, 248, 296; 350/164, 165; 351/166; 428/336, 339, 429, 539, 934, 938

[56] References Cited

U.S. PATENT DOCUMENTS

| | | | |
|---|---|---|---|
| 2,420,724 | 5/1947 | Rice | 427/35 |
| 3,756,193 | 9/1973 | Carmichael et al. | 427/38 |
| 3,953,652 | 4/1976 | Addis, Jr. et al. | 427/164 X |
| 3,984,581 | 10/1976 | Dobler et al. | 427/35 |

OTHER PUBLICATIONS

Kennedy et al., "Gas Scattering and Ion–Plating Deposition Methods", Research/Development, vol. 22, No. 11 (1971), pp. 40-44.

*Primary Examiner*—Bernard D. Pianalto
*Attorney, Agent, or Firm*—Haseltine, Lake & Waters

[57] ABSTRACT

A process for the surface treatment of a synthetic resin lens comprising applying to the surface of a lens body made of synthetic resin such as allyl resin or the like a coating film of glass by a high-vacuum electric-field vapor deposition treatment. The glass coated lens body may then be formed with an anti-reflection coating film of magnesium fluoride or the like, also by a high-vacuum electric-field vapor deposition treatment.

6 Claims, 3 Drawing Figures

PROCESS FOR THE SURFACE TREATMENT OF A SYNTHETIC RESIN LENS AND THE PRODUCT THEREOF

This is a continuation of application Ser. No. 714,262 filed Aug. 13, 1976 and now abandoned.

FIELD OF THE INVENTION

This invention relates to a process for the surface treatment of a synthetic resin lens and to the product obtained thereby.

BACKGROUND OF THE INVENTION

Generally, a synthetic resin lens is advantageous in that it has a low density and is highly resistant to mechanical shock but it is, on the contrary, deficient in that it has poor wear-resisting properties and has low surface hardness.

It has been proposed hitherto, to overcome these deficiencies, to apply on the surface of the resin lens a glass coating film, and it has been conventional in this case to form the coating by the usual vacuum vapor deposition treatment. The product thus obtained by this treatment, however, is deficient in that it is not durable because the coating film has an extremely low adhering force and it is easily peeled off. To increase the adhering force of the film, it is desirable to heat the lens to a temperature of about 300° C. However, the lens has poor heat-resistance and is not suitable for such heating. This is similar to the case in which an anti-reflection coating film of MgF2 or the like is to be applied to the lens. As a consequence an excellent lens product cannot be obtained.

SUMMARY OF THE INVENTION

An object of this invention is to provide a process and a product which is free from the deficiencies noted above.

According to the invention, a lens body made of synthetic resin such as allyl resin or the like has a glass coating film applied to its surface by a high-vacuum electric-field vapor deposition treatment. Namely, a vapor deposition of glass is effected within a comparatively high vacuum atmosphere under the action of an electric field.

In further accordance with the invention an anti-reflection coating film may be applied to the thus glass-coated lens body also by means of a high-vacuum electric-field vapor deposition treatment.

DETAILED DESCRIPTION

Figure 1:
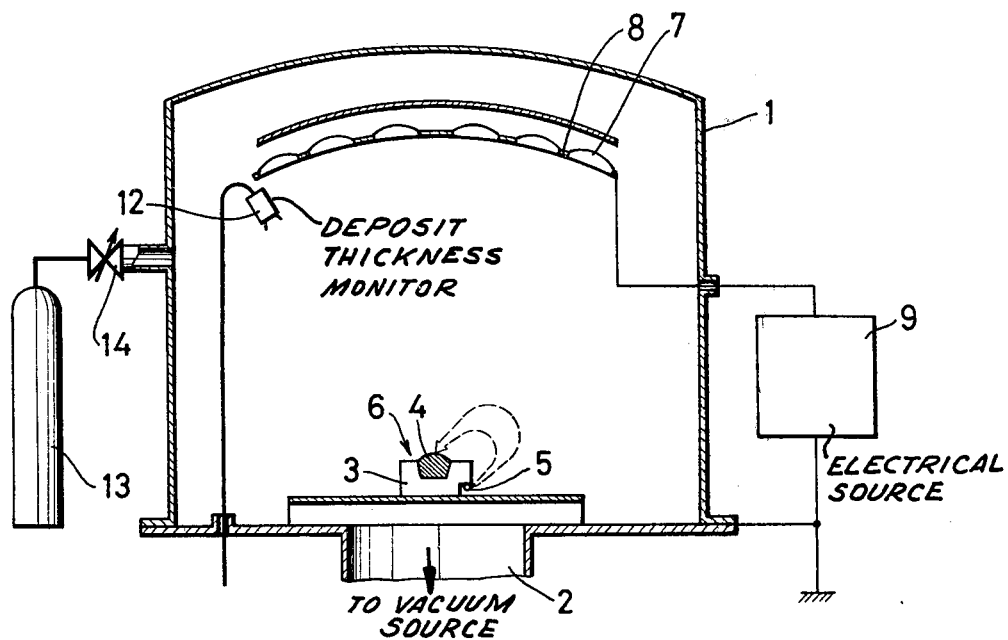
FIG. 1 is a sectional side view of one embodiment of apparatus for carrying out the process of the invention.
Figure 2:
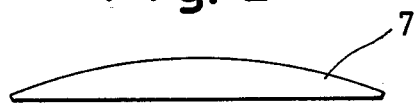
FIG. 2 is a side elevational view of the product thereof.

Referring to the drawing, numeral 1 denotes a treating chamber in the form of a bell jar and the interior of the treating chamber 1 is evacuated by a vacuum pump or the like (not shown) through an exhaust opening 2 in its bottom wall so that the chamber can have a high vacuum of about from $1 \times 10^{-4}$ to $2 \times 10^{-5}$ torrs, for instance, so that no glow discharge is caused therein in the course of the operation as described hereinafter.

The treating chamber 1 is provided at its lower portion with an evaporation source 6 comprising glass 4 in a crucible 3 and an electron gun 5 for emitting an output electron beam for irradiating the glass 4. Provided above the evaporation source 6 is a substrate holder 8 for holding at least one lens body 7 made of allyl resin or the like. The evaporation source 6 and the substrate holder 8 are connected to an electrical source 9 outside the treating chamber so that an electric field of D.C., A.C. or high frequency from about 50 to 100 volts/cm may be generated therein such that some of the glass vapor particles generated from the evaporation source 6 can be ionized and accelerated in speed within the electric field and advanced towards the lens body 7 along with neutral glass vapor particles so as to become adhered to the body 7. The vapor particles of the glass 4 become adhered as a coating film 10 on the lens body 7 by a high vacuum electric field vapor deposition treatment. The deposition rate is preferably about from 0.3 $\mu$/min. to 0.5 $\mu$/min., for instance, and the thickness of the glass coating film 10 on the surface of the lens body 7 is between about 1 to 10$\mu$ and preferably is about 4$\mu$.

Numeral 13 denotes an inert gas source such as for argon or the like, and the source is connected to the treating chamber 1 through a valve 14 so that the interior of the chamber 1 may be an inert gas atmosphere of the high-vacuum as noted above. In the case of an electric field of AC of high frequency, the frequency range thereof may be from 50 Hz to several tens of KHz.

Figure 3:
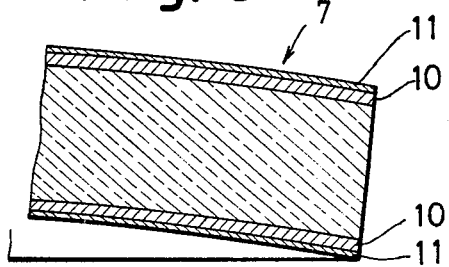
FIG. 3 is an enlarged sectional view of a portion of the product.

During the operation, the lens body 7 is turned upside down and is treated substantially in the same manner whereby the glass coating film 10 is formed on the front and rear surfaces of the body as shown clearly in FIG. 3.

Thereafter, without being exposed to the external air, the product thus obtained is subjected to a similar high-vacuum electric-field vapor deposition treatment within the chamber 1, after the evaporation source 6 with the glass 4 is replaced by a source with MgF2, whereby an anti-reflection coating film 11 of MgF2 can be obtained on the glass coating film 10 so as to have a thickness of about 1500 Angstroms.

Numeral 12 denotes a device for monitering deposit thickness.

During the foregoing operations, the interior of the treating chamber 1 is maintained at such a comparatively high vacuum as mentioned before, so that no glow discharge is produced, this preventing if, such glow discharge were generated, heating of the lens body 7 by ion bombardment and consequent thermal deformation, thermal damage or the like.

The product thus obtained is somewhat lacking in waterproof property, so that it is desirable that a water repelling treatment be carried out using silicone oil or the like to be applied on the body both before the formation of the glass coating film 10 and after the formation of the MgF2 coating film 11.

It has been confirmed that the product thus obtained is satisfactory in a temperature rising and falling cycle test between a normal temperature, 8 hours and 80° C., 16 hours and a temperature rising and falling cycle test between a normal temperature, 1 hour and −30° C., 7 hours, and also is satisfactory in a heat resistance test of increase of temperature to 100° C. and is also satisfactory in an adhering test using an adhesive tape. Additionally it is satisfactory in a waterproof test in which the lens is immersed in hot water at 50° C. for 30 minutes or in water at 20° C. for 6 hours.

Thus, according to this invention, the formation of the glass coating film and additionally that of the anti-reflection coating film is carried out by the high-vacuum electric-field vapor deposition treatment without accompanying glow discharge, so that the glass vapor particles can be driven into the lens body by the action of the electric field and the film of strong adhering force can be obtained on the surface thereof, which will not peel off during its use. Additionally, any temperature increase by ion bombardment or the like is not produced on the lens body surface and thus the lens body can be protected from the adverse effects of heat and there is not caused any disadvantage such as thermal deformation or the like.

What is claimed is:

1. A process for the surface treatment of a synthetic resin lens comprising applying to the surface of a lens body made of synthetic resin a coating film of glass by a high-vacuum electric-field vapor deposition treatment including the steps of mounting the resin lens body in a treating chamber, introducing an evaporation source in the chamber, evacuating the chamber to a comparatively high vacuum of about from $1 \times 10^{-4}$ to $2 \times 10^{-5}$ torr and generating between the lens body and the evaporation source an electric field of about 50 to 100 volts/cm, the evaporation source being formed as a crucible containing the glass with an electron gun for irradiation thereof.

2. A process as claimed in claim 1 comprising applying to the glass-coated lens body an anti-reflection coating film by the high-vacuum electric-field vapor deposition treatment.

3. A process as claimed in claim 2 comprising applying a water-repelling substance on the lens body before the formation of the glass coating film and on the anti-reflection coating film after the formation of the anti-reflection coating film.

4. The product obtained by the process as claimed in claim 2.

5. The product as claimed in claim 4, wherein the glass coating has a thickness from 1 to $10\mu$.

6. The product as claimed in claim 4, wherein the anti-reflection coating film has a thickness of about 1500 Angstroms.

* * * * *